(12) United States Patent
More et al.

(10) Patent No.: US 11,855,176 B2
(45) Date of Patent: Dec. 26, 2023

(54) FINFET STRUCTURE WITH DOPED REGION

(71) Applicant: Taiwan Semiconductor Manufacturing Co., Ltd., Hsinchu (TW)

(72) Inventors: Shahaji B. More, Hsinchu (TW); Chun-Hsiung Tsai, Xinpu Township, Hsinchu County (TW); Cheng-Yi Peng, Taipei (TW); Shih-Chieh Chang, Taipei (TW); Kuo-Feng Yu, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 379 days.

(21) Appl. No.: 16/995,253

(22) Filed: Aug. 17, 2020

(65) Prior Publication Data
US 2020/0381534 A1    Dec. 3, 2020

Related U.S. Application Data

(63) Continuation of application No. 16/517,204, filed on Jul. 19, 2019, now Pat. No. 10,749,010, which is a continuation of application No. 15/994,691, filed on May 31, 2018, now Pat. No. 10,361,279.

(60) Provisional application No. 62/590,458, filed on Nov. 24, 2017.

(51) Int. Cl.
*H01L 29/78* (2006.01)
*H01L 29/08* (2006.01)
*H01L 29/66* (2006.01)
*H01L 29/417* (2006.01)

(52) U.S. Cl.
CPC .... *H01L 29/66492* (2013.01); *H01L 29/0847* (2013.01); *H01L 29/66575* (2013.01); *H01L 29/66636* (2013.01); *H01L 29/66795* (2013.01); *H01L 29/66803* (2013.01);
(Continued)

(58) Field of Classification Search
CPC ......... H01L 29/0847; H01L 29/66795–66818; H01L 29/66492; H01L 29/7833; H01L 29/7834; H01L 29/7836; H01L 29/785–7854; H01L 2029/7857; H01L 2029/7858; H01L 29/41791
See application file for complete search history.

(56) References Cited

U.S. PATENT DOCUMENTS

| 8,796,666 | B1 | 8/2014 | Huang et al. |
| 8,815,712 | B2 | 8/2014 | Wan et al. |
| 8,963,258 | B2 | 2/2015 | Yu et al. |

(Continued)

*Primary Examiner* — Robert G Bachner
*Assistant Examiner* — Molly K Reida
(74) *Attorney, Agent, or Firm* — Birch, Stewart, Kolasch & Birch, LLP

(57) ABSTRACT

Semiconductor structures are provided. The semiconductor structure includes a fin structure protruding from a substrate and a doped region formed in the fin structure. The semiconductor structure further includes a metal gate structure formed across the fin structure and a gate spacer formed on a sidewall of the metal gate structure. The semiconductor structure further includes a source/drain structure formed over the doped region. In addition, the doped region continuously surrounds the source/drain structure and is in direct contact with the gate spacer.

20 Claims, 10 Drawing Sheets

(52) U.S. Cl.
CPC ...... *H01L 29/7833* (2013.01); *H01L 29/7851* (2013.01); *H01L 29/41791* (2013.01)

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2014/0264575 A1 | 9/2014 | Tsai et al. |
| 2014/0273379 A1 | 9/2014 | Tsai et al. |
| 2015/0091086 A1 | 4/2015 | Lu et al. |
| 2015/0270342 A1 | 9/2015 | Tsai et al. |
| 2015/0294881 A1 | 10/2015 | Tsai et al. |
| 2015/0318381 A1 | 11/2015 | Tsai et al. |
| 2016/0043190 A1 | 2/2016 | Banghart et al. |
| 2016/0087053 A1* | 3/2016 | Kim ................ H01L 21/823821 257/369 |
| 2016/0087104 A1* | 3/2016 | Lee .................. H01L 29/66795 257/192 |
| 2016/0155837 A1 | 6/2016 | Lee et al. |
| 2017/0186748 A1* | 6/2017 | Lee ................ H01L 21/823821 |
| 2019/0148527 A1 | 5/2019 | More et al. |

* cited by examiner

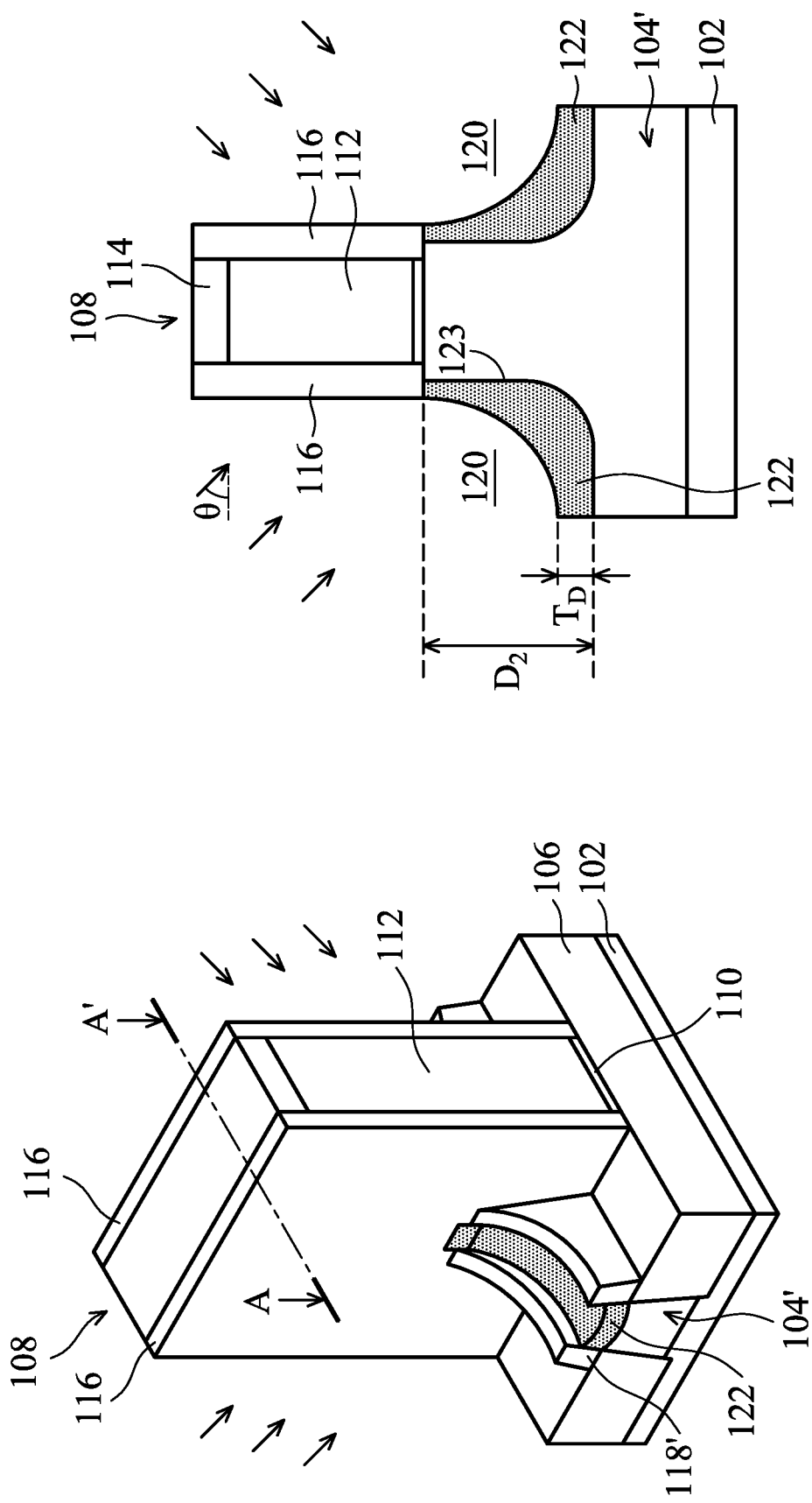

FINFET STRUCTURE WITH DOPED REGION

PRIORITY CLAIM AND CROSS-REFERENCE

This application is a Continuation application of U.S. application Ser. No. 16/517,204 filed Jul. 19, 2019, which is a Continuation application of U.S. application Ser. No. 15/994,691 filed May 31, 2018 (now U.S. Pat. No. 10,361,279 issued on Jul. 23, 2019), which claims the benefit of U.S. Provisional Application No. 62/590,458, filed on Nov. 24, 2017, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in semiconductor devices is the higher levels of integration of circuits. This may be accomplished by using structures such as FinFET structures. A typical FinFET structure includes a vertical fin-shape structure and a gate formed over the fin-shape structure.

However, although existing FinFET manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1E-2 illustrates a cross-sectional representation of the FinFET structure shown along line A-A' in FIG. 1E-1 in accordance with some embodiments.

FIG. 1F-1 illustrates a perspective view of the FinFET structure in accordance with some embodiments.

FIG. 1F-2 illustrates a cross-sectional representation of the FinFET structure shown along line A-A' in FIG. 1F-1 in accordance with some embodiments.

FIG. 1G-1 illustrates a perspective view of the FinFET structure in accordance with some embodiments.

FIG. 1G-2 illustrates a cross-sectional representation of the FinFET structure shown along line A-A' in FIG. 1G-1 in accordance with some embodiments.

FIG. 1H-1 illustrates a perspective view of the FinFET structure in accordance with some embodiments.

FIG. 1H-2 illustrates a cross-sectional representation of the FinFET structure shown along line A-A' in FIG. 1H-1 in accordance with some embodiments.

FIG. 1I-1 illustrates a perspective view of the FinFET structure in accordance with some embodiments.

FIG. 1I-2 illustrates a cross-sectional representation of the FinFET structure shown along line A-A' in FIG. 1I-1 in accordance with some embodiments.

FIG. 2 is a perspective view of a FinFET structure 100a in accordance with some embodiments.

DETAILED DESCRIPTION

Figure 1B:
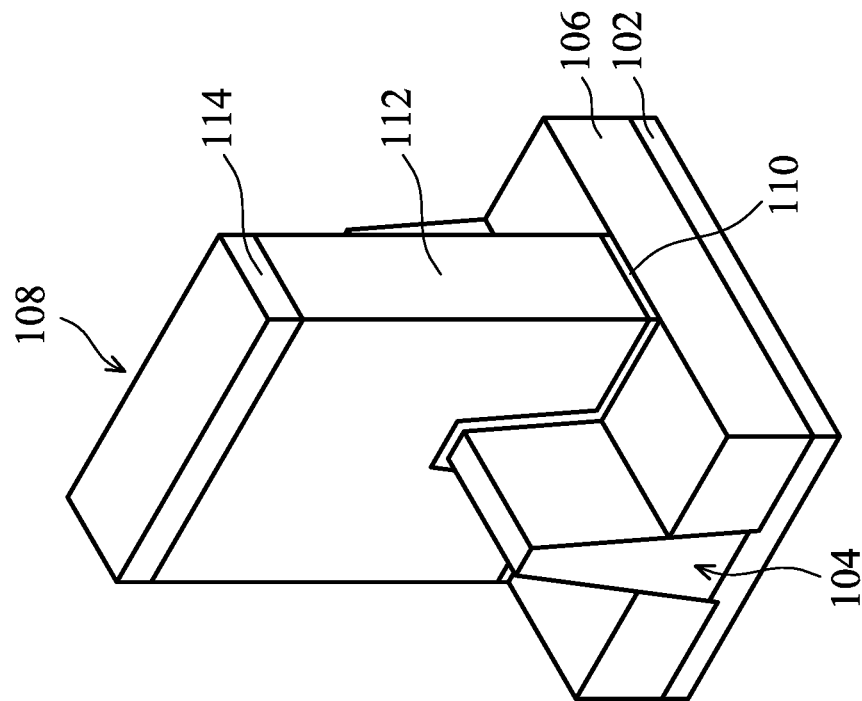
FIGS. 1A, 1B, 1C, and 1D illustrate perspective views of various stages of manufacturing a FinFET structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor structures are provided. The semiconductor structures may be FinFET structures. The method forming the FinFET structure may include forming a fin structure and a gate structure across the fin structure. The fin structure may be etched to form a recess and a doped region may be formed in the fin structure around the recess. After the doped region is formed, a source/drain structure may be formed in the recess. The doped region may be used as a lightly-doped-drain (LDD) region in the FinFET structure.

FIGS. 1A to 1D and 1E-1 to 1I-1 illustrate perspective views of various stages of manufacturing a FinFET structure 100 in accordance with some embodiments. FIGS. 1E-2 to 1I-2 illustrate cross-sectional representations of the FinFET structure shown along line A-A' in FIGS. 1E-1 to 1I-1 in accordance with some embodiments. As show in FIG. 1A, a fin structure 104 is formed over a substrate 102 in accordance with some embodiments. In some embodiments, the fin structure 104 is formed by patterning the substrate 102. In some embodiments, the fin structure 104 has a narrow top portion and a wide bottom portion and therefore has slope sidewalls.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP. In some embodiments, the fin structure 104 is made of SiGe.

Figure 1A:
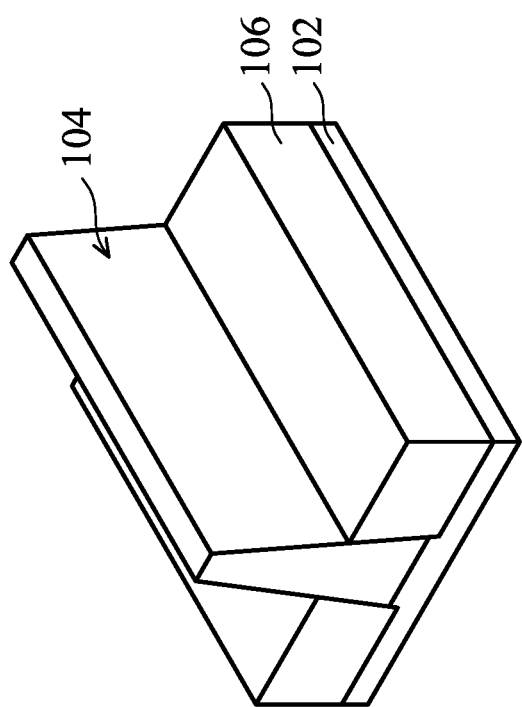

After the fin structure 104 is formed, an isolation structure 106 is formed over the substrate 102, and the fin structure 104 is surrounded by the isolation structure 106, as shown in FIG. 1A in accordance with some embodiments. The isolation structure 106 may be formed by depositing an insulating layer over the substrate 102 and recessing the insulating layer. In some embodiments, the isolation structure 106 is made of silicon oxide, silicon nitride, silicon oxynitride, fluoride-doped silicate glass (FSG), or other low-K dielectric materials.

Next, a gate structure 108 is formed across the fin structure 104 and extends onto the isolation structure 106, as shown in FIG. 1B in accordance with some embodiments. The gate structure 108 may be a dummy gate structure which will be replaced by a metal gate structure afterwards.

In some embodiments, the gate structure 108 includes a gate dielectric layer 110, a gate electrode layer 112 formed over the gate dielectric layer 110, and a hard mask layer 114 formed over the gate electrode layer 112. In some embodiments, the gate dielectric layer 110 is made of silicon oxide. In some embodiments, the gate electrode layer 112 is made of polysilicon. In some embodiments, the hard mask layer 114 is made of silicon nitride.

Figure 1D:
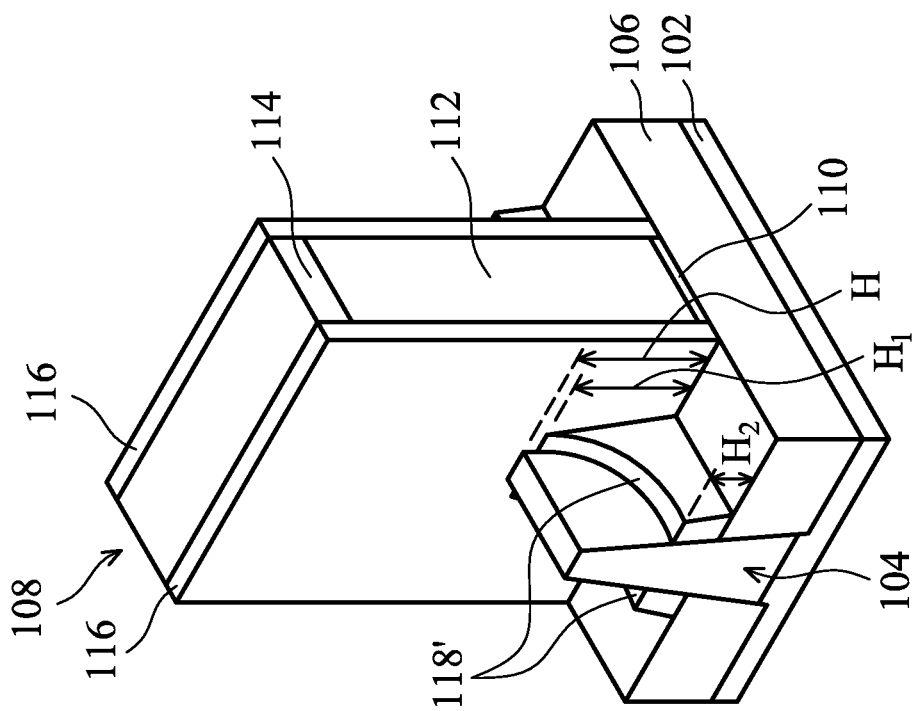
Figure 1C:
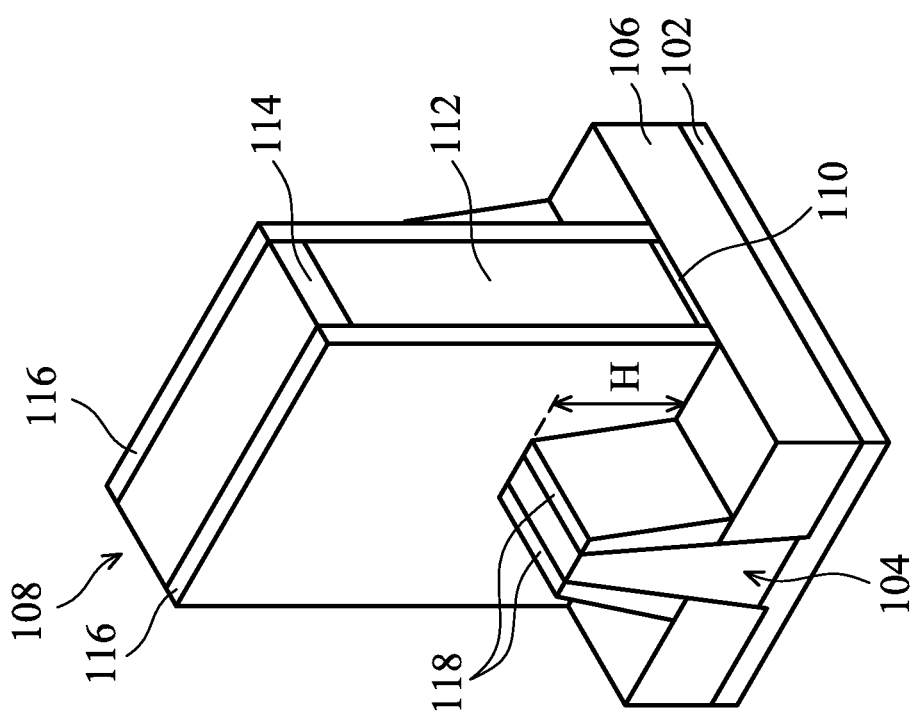

After the gate structure 108 is formed, gate spacers 116 are formed on the sidewalls of the gate structure 108, as shown in FIG. 1C in accordance with some embodiments. In some embodiments, the gate spacers 116 are made of silicon nitride, silicon oxide, silicon oxynitride, silicon carbide, or other applicable dielectric materials.

In addition, fin spacers 118 are formed on the sidewalls of the fin structure 104 in accordance with some embodiments. As shown in FIG. 1C, the height of the fin spacer 118 at this stage is substantially equal to the fin height H in accordance with some embodiments. In some embodiments, the fin spacers 118 are made of silicon nitride, silicon oxide, silicon oxynitride, silicon carbide, or other applicable dielectric materials. In some embodiments, the gate spacers 116 and the fin spacers 118 are made of the same material. In some embodiments, the gate spacers 116 and the fin spacers 118 are formed by depositing a spacer layer and etching the spacer layer.

Next, the fin spacers 118 are partially removed, as shown in FIG. 1D in accordance with some embodiments. A mask structure (not shown) may be formed over the gate structure 108 and the gate spacers 116 when the top portions of the fin spacers 118 are removed. In some embodiments, the fin spacers 118 are partially removed by etching the top portions of the fin spacers 118 to form etched fin spacers 118'.

In some embodiments, the etched fin spacer 118' has a first sloping top surface, as shown in FIG. 1D. More specifically, the etched fin spacer 118' has a first height $H_1$ close to the gate structure 108 and a second height Hz away from the gate structure 108. In some embodiment, the first height $H_1$ is lower than the fin height H. In some embodiments, the first height $H_1$ is greater than the second height Hz. In some embodiments, the difference between the first height $H_1$ and the second height Hz is in a range from about 5 nm to about 50 nm.

Figures 1, 1E, 2:
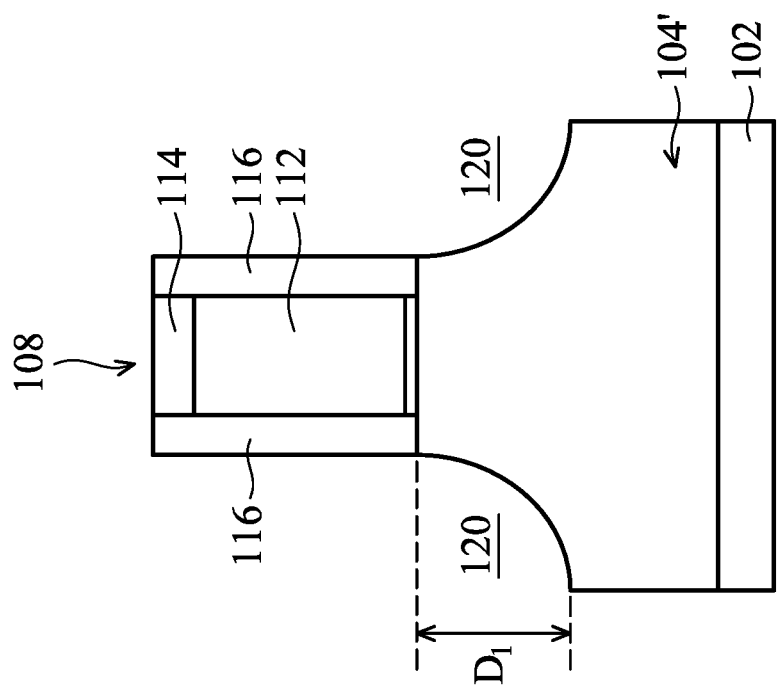
Figures 1, 1E:
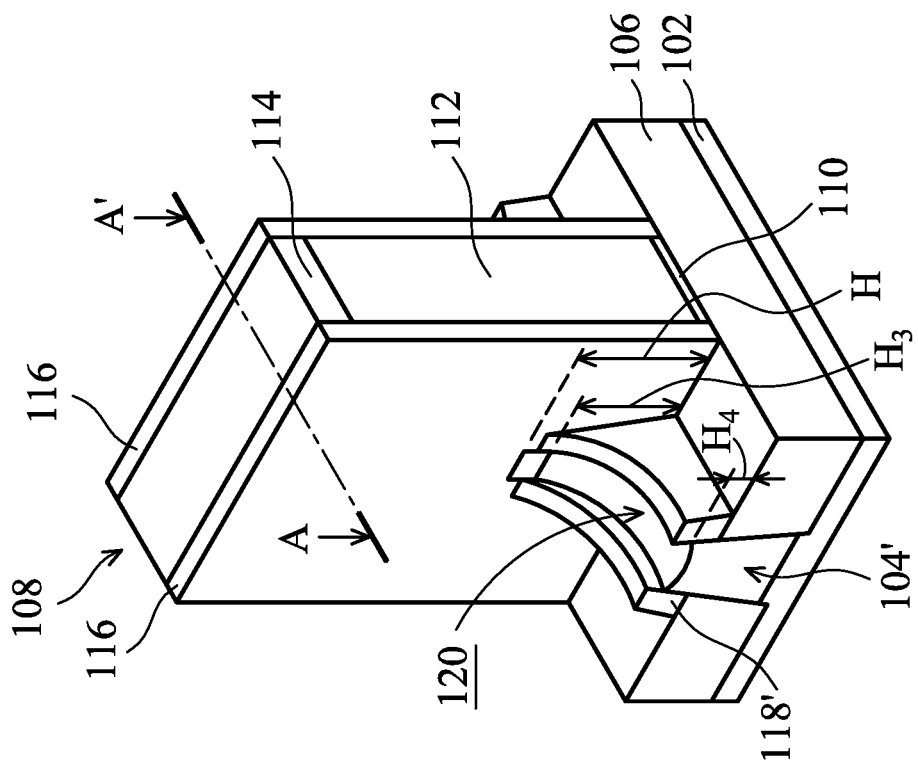
FIG. 1E-1 illustrates a perspective view of the FinFET structure in accordance with some embodiments.

Next, the fin structure 104 is recessed to form recesses 120, as shown in FIGS. 1E-1 and 1E-2 in accordance with some embodiments. The recesses 120 in the recessed fin structure 104' may be formed by etching the top portions of the fin structure 104' not covered by the gate structure 108 and the gate spacers 116. In addition, the recess 120 may be relatively shallow, compared to the whole fin structure 104'. In some embodiments, the top surface of the bottommost portion of the recess 120 is higher than the top surface of the isolation structure 106. In some embodiments, the recess 120 has a depth $D_1$ in a range from about 15 nm to about 35 nm. The depth $D_1$ of the recess 120 may be measured from the original top surface of the fin structure 104' to a bottommost portion of the recess 120, as shown in FIG. 1E-2.

As show in FIGS. 1E-1 and 1E-2, the recess 120 has a second sloping top surface, and the profile of the second sloping top surface of the recess 120 may be similar to the profile of the first sloping top surface of the etched fin spacer 118'. That is, the profile of the recess 120 may be adjusted by adjusting the profile of the etched fin spacer 118'. In addition, the second sloping top surface of the recess 120 is lower than the first sloping top surface of the etched fin spacer 118' in accordance with some embodiments.

More specifically, the fin structure 104' has a third height $H_3$ at a first edge of the recess 120 close to the gate structure 108 and a fourth height $H_4$ at a second edge of the recess 120 away from the gate structure 108. In some embodiment, the third height $H_3$ of the recessed fin structure 104' is lower than the first height $H_1$, and the fourth height $H_4$ is lower than both the third height $H_3$ and the second height $H_2$. In some embodiments, the difference between the third height $H_3$ and the fourth height $H_4$ is in a range from about 5 nm to about 50 nm.

After the recesses 120 are formed, doped regions 122 are formed in the fin structure 104', as shown in FIGS. 1F-1 and 1F-2 in accordance with some embodiments. In some embodiments, the thickness of the doped region 122 is in a range from about 10 nm to about 20 nm. In some embodiments, the doped regions 122 are formed by performing an implantation process on the recesses 120. In some embodiments, first dopants are implanted from the recesses 120 to form the doped regions 122 during the implantation process. In some embodiments, the first dopants in the doped regions 122 include germanium (Ge), boron (B), phosphorous (P), arsenic (As), Sb (antimony), or combinations thereof. In some embodiments, both Ge and B are implanted in the doped regions 122. In some embodiments, Ge, P and As are implanted in the doped regions 122. In some embodiments, the implantation process includes using $BF_2$. In some embodiments, the implanting energy used in the implantation process is in a range from about 1 Kev to about 5 Kev. In some embodiments, the first dopants are implanted in the doped regions 122 at a dose in a range from about $1\times10^{14}$ atom/cm$^2$ to about $1\times10^{15}$ atom/cm$^2$.

Since the recesses 120 are first formed in the fin structure 104' and the first dopants are implanted into the fin structures 104' from the recesses 120 afterwards, the first dopants can be implanted into a relatively deep region in the fin structure 104' and the dopant concentration may be easier to control. That is, the doped regions 122 may have a relatively great depth $D_2$. In some embodiments, the depth $D_2$ of the doped region 122 is in a range from about 25 nm to about 55 nm.

In some embodiments, the difference between the depth $D_1$ and the depth $D_2$ is in a range from about 10 nm to about 20 nm. In some embodiments, the bottommost portion of the doped region 122 is substantially level with the top surface of the isolation structure 106.

In addition, the first dopants may be implanted into the fin structure 104' along a first direction, so that an edge 123 of the doped region 122 is located directly under the gate spacer 116. In some embodiments, the angle θ between the first direction and the top surface of the substrate 102 is in a range from about 85° to about 95°.

Figures 1, 1G:
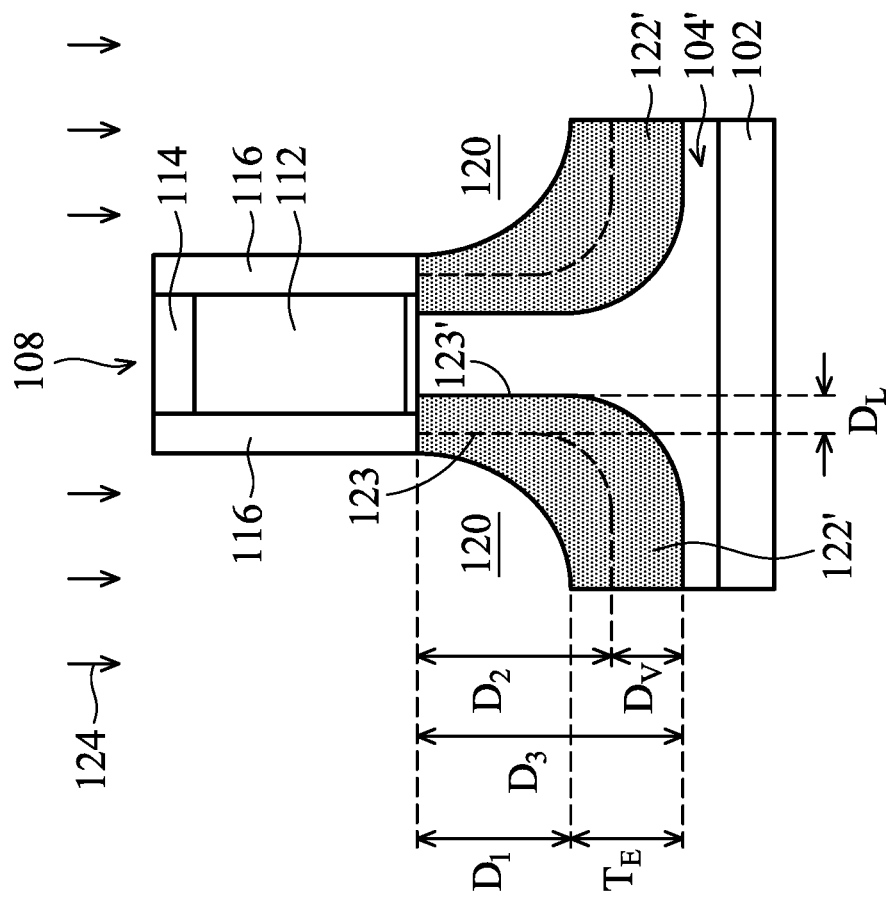
Figures 1, 1G, 2:
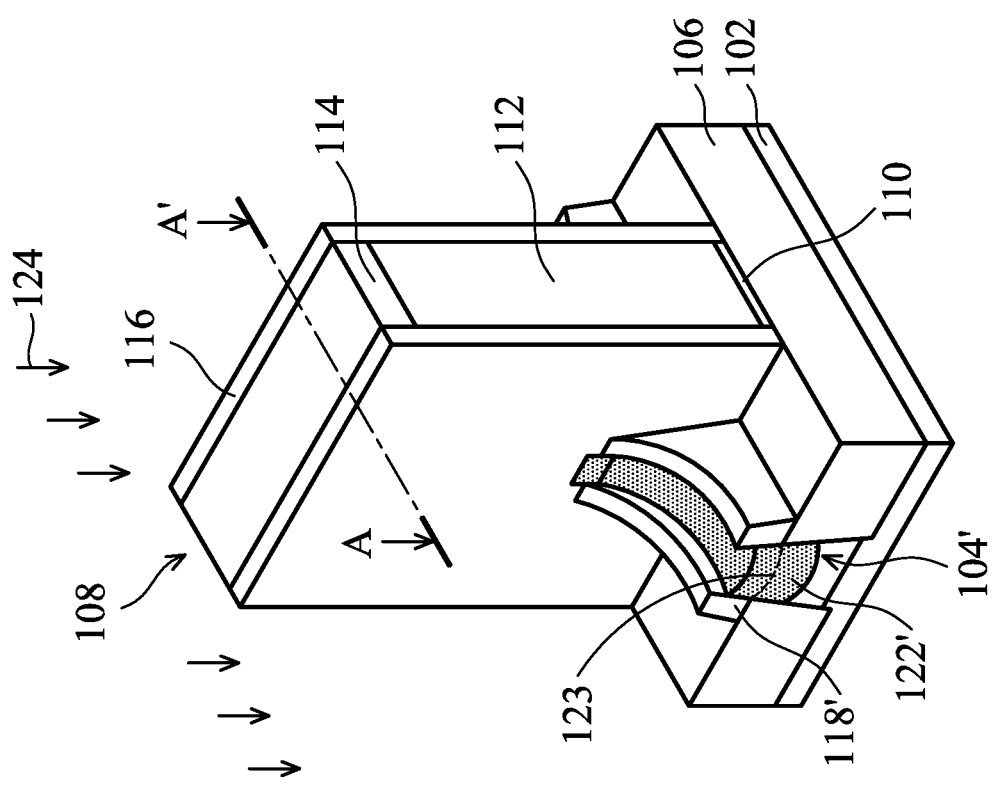

After the doped regions 122 are formed, an annealing process 124 is performed, as shown in FIGS. 1G-1 and 1G-2 in accordance with some embodiments. During the annealing process 124, the first dopants in the original doped region 122 diffuse within the fin structure 104' to form an expanded doped region 122', as shown in FIG. 1G-2 in accordance with some embodiments. More specifically, the first dopants in the original doped regions 122 diffuse into a region under the gate structure 108, such that an edge 123' of the expanded doped region 122' is located directly under the gate structure 108 in accordance with some embodiments. In some embodiments, the lateral diffusion distance $D_L$ of the first dopants during the annealing process 124 is in a range from about 3 nm to about 9 nm.

Furthermore, the first dopants in the original doped region 122 also diffuse into a deeper region of the fin structure 104', so that the depth $D_3$ of the expanded doped region 122' is greater than the depth $D_2$ of the original doped region 122. As described previously, the doped regions 122 are formed after the recesses 120 are formed in the fin structure 104', therefore the doped regions 122 may have a relatively great depth $D_2$. In addition, the doped regions 122 may be expanded to form the expanded doped regions 122' by performing the annealing process 124, and therefore the expanded doped regions 122 may further extend into an even deeper region in the fin structure 104'. In some embodiments, the bottommost portion of the original doped region 122 is substantially level with the top surface of the isolation structure 106, and the bottommost portion of the expanded doped region 122' is lower than the top surface of the isolation structure 106 after the annealing process 124 is performed.

In some embodiments, during the annealing process 124, the vertical diffusion distance $D_V$ of the first dopants is greater than the lateral diffusion distance $D_L$ of the first dopants. In some embodiments, a ratio of the vertical diffusion distance $D_V$ of the first dopants during the annealing process 124 to the lateral diffusion distance $D_L$ of the first dopants during the annealing process 124 is in a range from about 3:1 to about 2:1. In some embodiments, the vertical diffusion distance $D_V$ of the first dopants during the annealing process 124 is in a range from about 5 nm to about 15 nm. In some embodiments, the expanded doped region 122' has a thickness $T_E$ in a range from about 5 nm to 30 nm. In some embodiments, a ratio of the depth $D_1$ of the recess 120 to the thickness $T_E$ of the expanded doped regions 122' is in a range from about 0.6 to about 1.2. As described previously, forming doped regions in the deep region of the fin structure may be challenging. Therefore, dopants are implanted into the fin structure 104' from the recesses 120 and the annealing process 124 is performed, so that the extended doped regions 122' can be formed in the relatively deep region of the fin structure 104'. In addition, the thickness $T_E$ of the resulting extended doped regions 122' is controlled so they may be seen as an extension of the source/drain structures formed in the recesses 120 in subsequent manufacturing processes.

In some embodiments, the annealing process 124 is performed at a temperature in a range from about 500° C. to about 700° C. In some embodiments, the annealing process 124 is performed for about 100 sec to about 300 sec. After the annealing process 124 is performed, the dopant concentration at the bottom of the expanded doped region 122' may be lower than the dopant concentration at the top of the expanded doped region 122'.

Figures 1, 1H, 2:
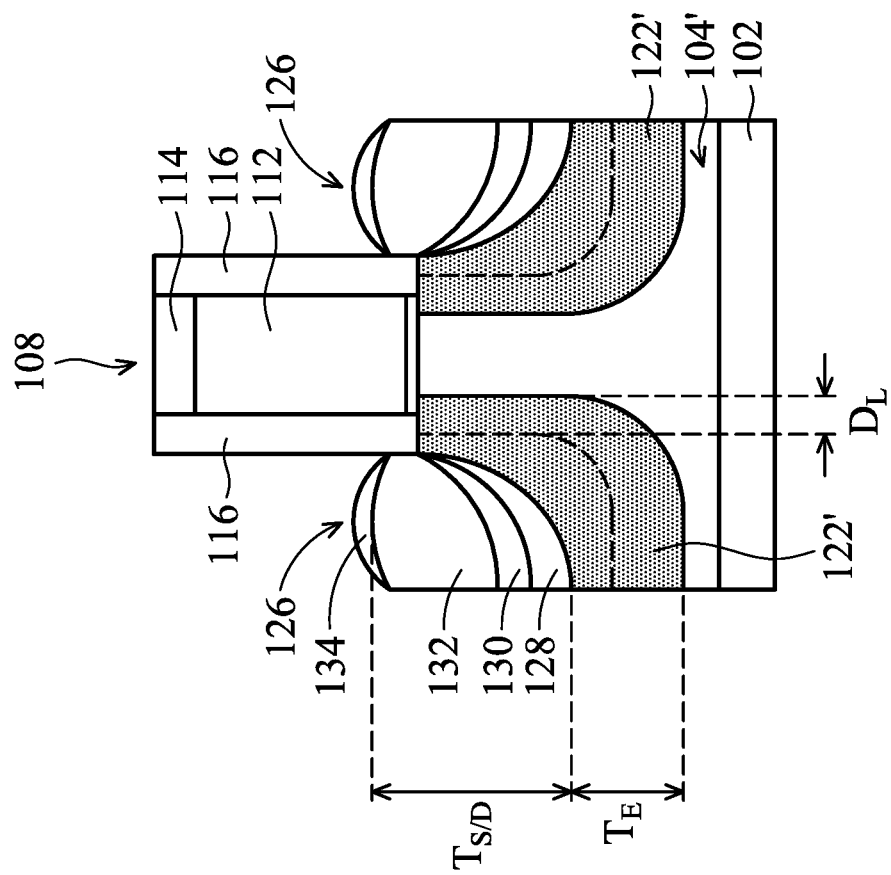
Figures 1, 1H:
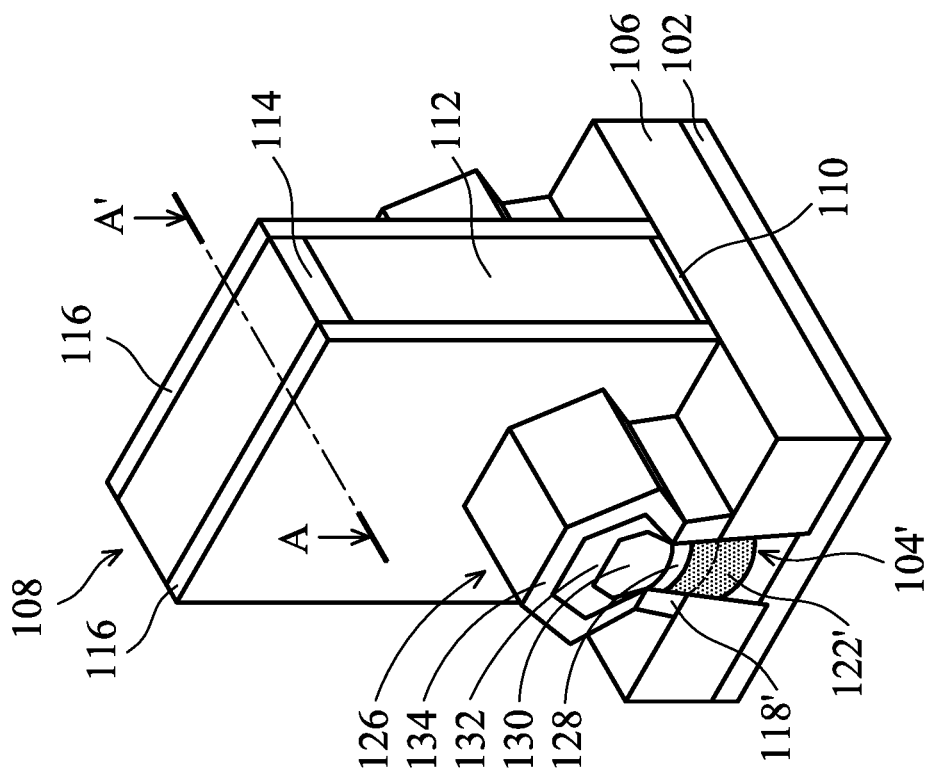

After the annealing process 124 is performed, source/drain structures 126 are formed in the recesses 120, as shown in FIGS. 1H-1 and 1H-2 in accordance with some embodiments. More specifically, the source/drain structures 126 are directly formed over and in direct contact with the expanded doped regions 122' in accordance with some embodiments. In some embodiments, the source/drain structures 126 are formed by epitaxially growing in an epitaxial-growth chamber. In some embodiments, the source/drain structures 126 are formed by performing a remote-plasma chemical vapor deposition (RPCVD). In some embodiments, the annealing process 124 and the formation of the source/drain structures 126 are performed in the same chamber.

In some embodiments, the source/drain structures 126 are raised source/drain structures with a thickness $T_{S/D}$ in a range from about 20 nm to about 40 nm. In some embodiments, the source/drain structure 126 includes a first region 128, a second region 130 over the first region 128, and a third region 132 over the second region 130. In addition, the extended doped regions 122' may be seen as an extension of the source/drain structure 126. In some embodiments, a ratio of thickness $T_{S/D}$ to thickness $T_E$ is in a range from about 0.8 to about 1.2. As described previously, the extended doped regions 122' are formed under the recesses 120 in which the source/drain structures 126 are formed afterward, so extended doped regions 122' may be seen as extensions of the source/drain structures 126. In addition, the dopant concentration in the extended doped regions 122' may be easier to control.

In some embodiments, the first region 128, the second region 130, and the third region 132 respectfully includes second dopants. In some embodiments, the second dopants include germanium (Ge), boron (B), phosphorous (P), arsenic (As), Sb (antimony), or combinations thereof.

In some embodiments, the dopant concentration of the second dopant in the third region is greater than the dopant concentration of the second dopant in the second region. In some embodiments, the dopant concentration of the second dopant in the second region is greater than the dopant concentration of the second dopant in the first region.

In some embodiments, the first dopants in the expanded doped regions 122' and the second dopants in the source/drain structures 126 are the same type of dopants. In some embodiments, the first dopants in the expanded doped regions 122' and the second dopants in the source/drain structures 126 are the same dopants. In some embodiments, the first dopants in the expanded doped regions 122' and the second dopants in the source/drain structures 126 are different dopants. In some embodiments, the dopant concentration in the expanded doped region 122' is lower than the dopant concentration in the first region 128 of the source/drain structure 126.

A cap layer 134 is formed over the third region 132 of the source/drain structures 126, as shown in FIGS. 1H-1 and 1H-2 in accordance with some embodiments. In some embodiments, the cap layer 134 is made of Si, P doped SiGe, SiP, B doped with SiGe, or the like.

Figures 1, 1I, 2:
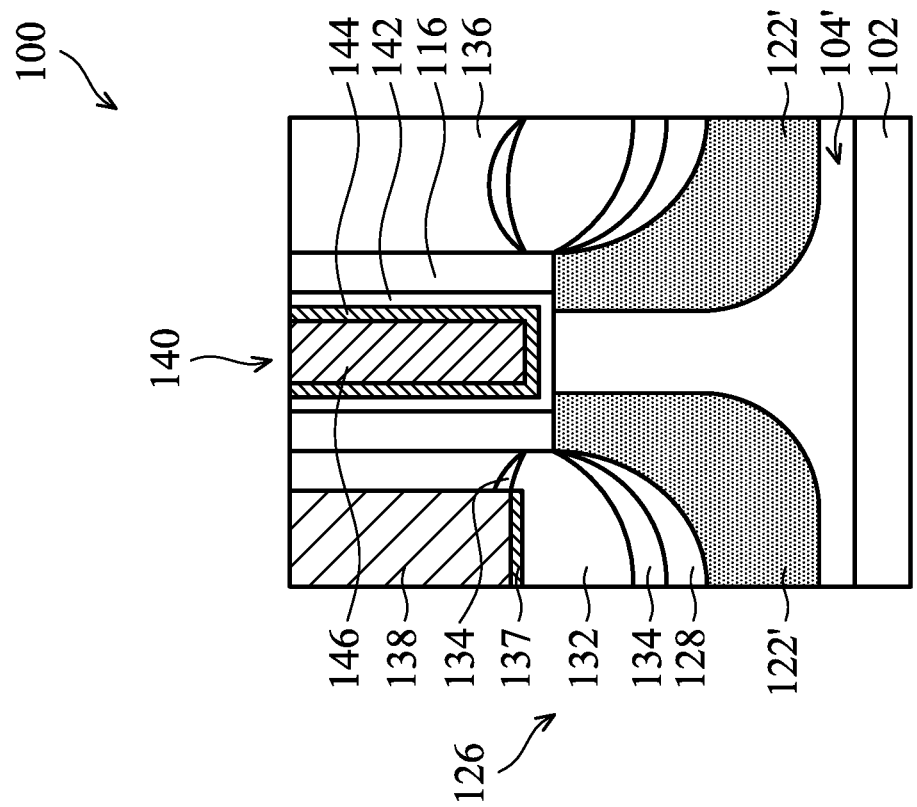
Figures 1, 1I:
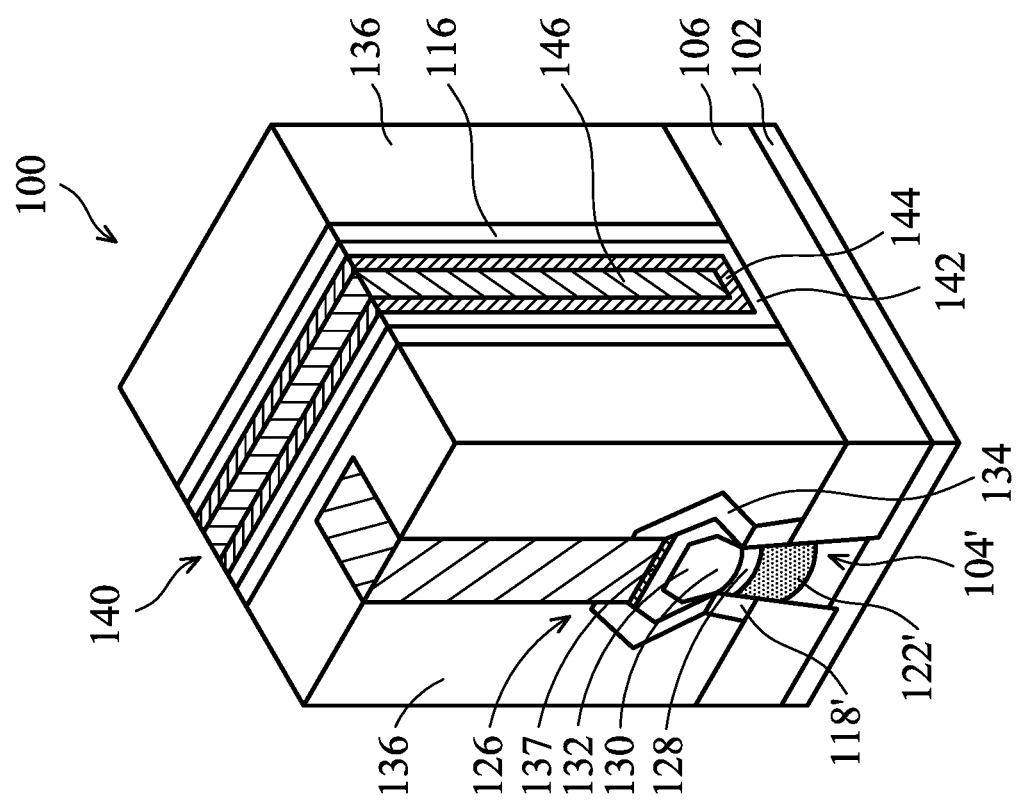
Figure 2:
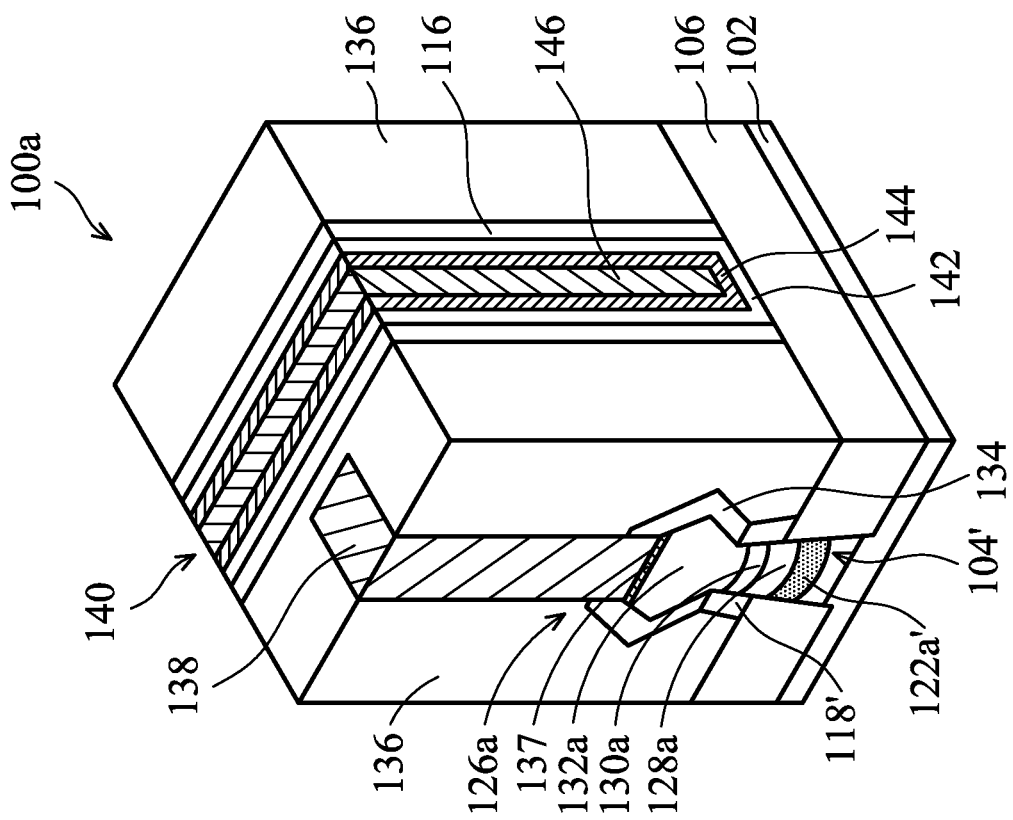

Next, an interlayer dielectric (ILD) layer 136 is formed to cover the source/drain structures 126 and the isolation structures 106, as shown in FIGS. 1I-1 and 1I-2 in accordance with some embodiments. The interlayer dielectric layer 136 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 136 may be formed by chemical vapor deposition (CVD), physical vapor deposition, (PVD), atomic layer deposition (ALD), or other applicable processes.

After the interlayer dielectric layer 136 is formed, the gate structure 108 is replaced by a metal gate structure 140, as shown in FIGS. 1I-1 and 1I-2 in accordance with some embodiments. In some embodiments, the metal gate structure 140 includes a gate dielectric layer 142, a work function metal layer 144, and a gate electrode layer 146. In some embodiments, the gate dielectric layer 142 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO$_2$—Al$_2$O$_3$) alloy, or other applicable dielectric materials.

The work function metal layer 144 is formed over the gate dielectric layer 142 in accordance with some embodiments. The work function metal layer 144 may be customized to have the proper work function. In some embodiments, the gate electrode layer 146 is made of a conductive material, such as aluminum, copper, tungsten, titanium, tantalum, or other applicable materials.

Next, a silicide layer 137 and a contact 138 is formed on the source/drain structure 126 through the interlayer dielectric layer 136, as shown in FIGS. 1I-1 and 1I-2 in accordance with some embodiments. In addition, the contact 138 passes through the cap layer 134 and is formed on the silicide layer 137 in accordance with some embodiments. As shown in FIG. 1I-1, the silicide layer 137 is in direct contact with the third region 132 of the source/drain structure 126 in accordance with some embodiments.

In some embodiments, the contact 138 includes aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantulum carbide (TaC), tantulum silicide nitride (TaSiN), tantalum carbide nitride (TaCN), titanium aluminide (TiAl), titanium aluminum nitride (TiAlN), other applicable conductive materials, or a combination thereof. In some embodiments, the contact 138 includes a titanium nitride layer and tungsten formed over the titanium nitride layer.

The contact 138 may further include a liner and/or a barrier layer. For example, a liner (not shown) may be formed on the sidewalls and bottom of the contact trench. The liner may be made of silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As shown in FIG. 1I-1, the FinFET structure 100 includes the expanded doped region 122' formed directly under and around the recesses 120, so that the sidewalls and bottom surface of the source/drain structure 126 are in direct contact with the extended doped regions 122' in accordance with some embodiments. As described above, it may be challenging to implant to dopants in the deeper region of a fin structure when manufacturing the FinFET structure. However, in accordance with some embodiments, the fin structure 104 is first partially recessed, and therefore the first dopants are implanted into the recessed fin structure 104' from the recesses 120. Therefore, the dopant concentration of doped regions 122, even at the deeper portion of the fin structure 104', can be controlled as designed.

Furthermore, after the doped regions 122 are formed, the annealing process 124 is performed to form the expanded doped regions 122', so that the first dopants can be diffused into the deeper region of the fin structure 104' and may diffuse to a region directly under the gate structure. Accordingly, the profile of the resulting expanded doped regions 122' may be easier to control. Since the deeper portion of the fin structure 104' has been doped as the expanded doped regions 122', electron efficiency of the source/drain structures 126 formed over the expanded doped regions 122' may be improved.

In addition, the second dopants in the source/drain structure 126 may be physically blocked by the expanded doped regions 122', so that the diffusion of the second dopants in the source/drain structure 126 into the channel region under the metal gate structure 140 may be prevented.

FIG. 2 is a perspective view of a FinFET structure 100a in accordance with some embodiments. The FinFET structure 100a shown in FIG. 2 is substantially the same as the FinFET structure 100 shown in FIGS. 1I-1 and 1I-2, except the top surface of its expanded doped region 122a' is lower than the top surface of the isolation structure 106 in accordance with some embodiments. Processes and materials for forming the FinFET structure 100a shown in FIG. 2 may be similar to, or the same as, those for forming the FinFET structure 100 shown in FIGS. 1A to 1D, 1E-1 to 1I-1, and 1E-2 to 1I-2 and are not repeated herein.

Similar to the processes shown in FIGS. 1A to 1I, a recess may be formed in the fin structure 104' and a doped region may be formed by implanting the first dopants from the recess. An annealing process, similar to the annealing process 124, may then be performed to form the expanded doped region 122a', and a source/drain structure 126a may be formed in the recess over the expanded doped region 122a'. In addition, the recess may be deeper than the recess 120 shown in FIG. 1E-2, and therefore the top surface of the expanded doped region 122a' is located at a deeper region of the fin structure 104'.

Furthermore, since the expanded doped region 122a' is formed at the relatively deeper region of the fin structure 104', compared to the expanded doped region 122' shown in FIG. 1I-1, a source/drain structure 126a formed over the expanded doped region 122a' may also extend to the deeper region of the fin structure 104'. In some embodiments, the source/drain structure 126a includes a first region 128a, a second region 130a, and a third region 132s, and the bottommost portion of the first region 128a is lower than the top surface of the isolation structure 106.

Processes and materials for forming the expanded doped region 122a' and the source/drain structure 126a including the first region 128a, the second region 130a, and the third region 132a shown in FIG. 2 may be similar to, or the same as the expanded doped region 122' and the source/drain structure 126 including the first region 128, the second region 130, and the third region 132 shown in FIGS. 1A to 1D, 1E-1 to 1I-1, and 1E-2 to 1I-2, and therefore details of them are not repeated herein.

Figure 3A:
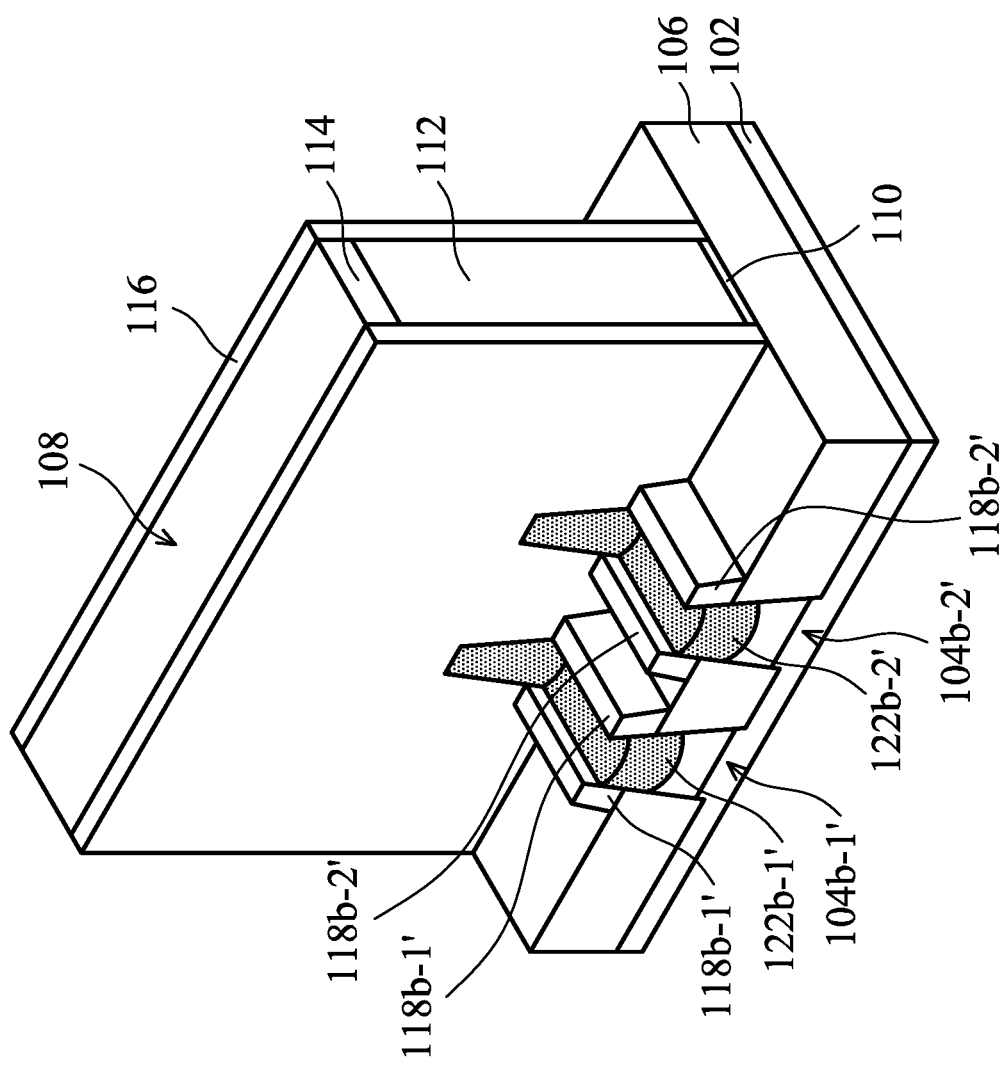
FIGS. 3A and 3B illustrate perspective views of various stages of manufacturing a FinFET structure in accordance with some embodiments.
Figure 3B:
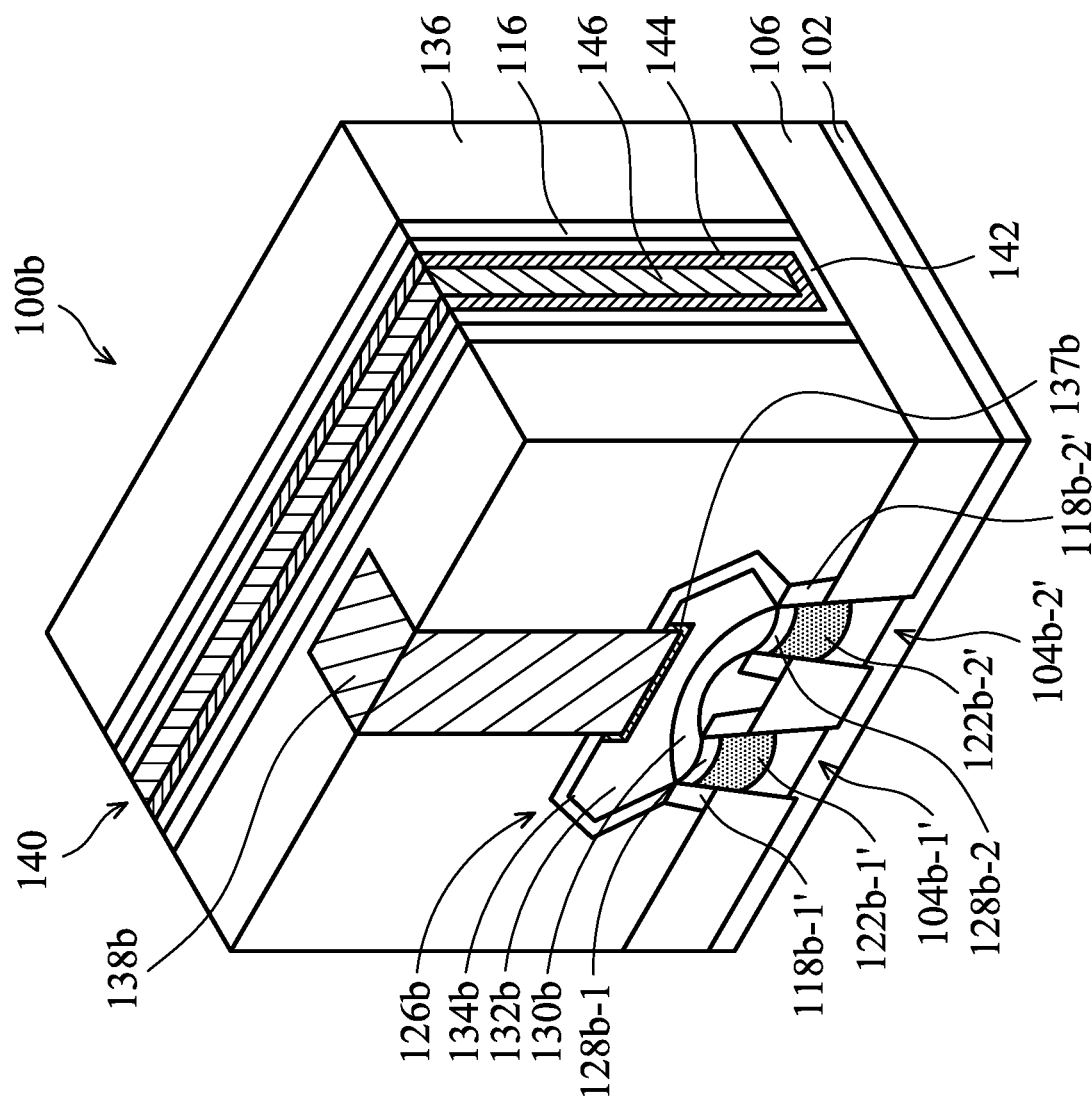

FIGS. 3A and 3B illustrate perspective views of various stages of manufacturing a FinFET structure 100b in accordance with some embodiments. The FinFET structure 100b is similar to the FinFET structure 100 described previously, except two source/drain structures of the FinFET structure 100b merge with each other in accordance with some embodiments. Processes and materials for forming the FinFET structure 100b shown in FIGS. 3A and 3B may be similar to, or the same as, those for forming the FinFET structure 100 shown in FIGS. 1A to 1D, 1E-1 to 1I-1, and 1E-2 to and are not repeated herein.

More specifically, a first fin structure and a second fin structure may be formed over the substrate 102, and the gate structure 108 may be formed across the first fin structure and the second fin structure, similar to those shown in FIGS. 1A and 1B. Processes and materials for forming a first fin structure and a second fin structure may be similar to, or the same as the fin structure 104 described previously.

Next, fin spacers may be formed and partially etched to form first etched fin spacers 118b-1' and second etched fin spacers 118b-2', and recesses may be formed in the first fin structure 104b-1' and the second fin structure 104b-2' after the fin spacers are etched, similar to those shown in FIGS. 1C, 1D, and 1E-1. Doped regions may then be formed by implanting the first dopants from the recesses, similar to those shown in FIG. 1F-1. Afterwards, an annealing process, similar to the annealing process 124, is then be performed to form a first expanded doped region 122b-1' and a second expanded doped region 122b-2', as shown in FIG. 3A in accordance with some embodiments.

Next, a source/drain material is grown in the recesses over the first expanded doped region 122b-1' and the second expanded doped region 122b-2', and the source/drain material over the first fin structure 104b-1' and the second fin structure 104b-2' merges together to form a merged source/drain structure 126b, as shown in FIG. 3B in accordance with some embodiments.

As shown in FIG. 3B, similar to source/drain structure 126 described previously, the merged source/drain structure 126b also includes first regions 128b-1 and 128b-2, a second region 130b, and a third region 132b in accordance with some embodiments. Processes and materials for forming the first regions 128b-1 and 128b-2, the second region 130b, and the third region 132b may be similar to, or the same as the first regions 128, the second region 130, and the third region 132 described previously. In addition, the first regions 128b-1 and 128b-2 are formed directly on the expanded doped regions 122b-1' and 122b-2' in accordance with some embodiments. The second region 130b is formed on both first regions 128b-1 and 128b-2 and the third region 132b is formed on the second region 130b. In addition, both of the top surface of the expanded doped regions 122b-1' and 122b-2' are higher than the top surface of the isolation structure 106 in accordance with some embodiments.

After the merged source/drain structure 126b is formed, a cap layer 134b is formed over the third region 132b of the merged source/drain structure 126b, as shown in FIG. 3B in accordance with some embodiments. Processes and materials for forming the cap layer 134b may be similar to, or the same as the cap layer 134 described previously. Afterwards, the interlayer dielectric layer 136, the silicide layer 137, and a contact 138b are formed, and the gate structure 108 is replaced by the metal gate structure 140 in accordance with some embodiments. Processes and materials for forming the contact 138b may be similar to, or the same as the contact 138 described previously. In addition, the contact 138b passes through the interlayer dielectric layer 136 and the cap layer 134b and is formed over the substantially central region of the source/drain structure 126b in accordance with some embodiments.

As described previously, in the FinFET structures 100, 100a, and 100b, the fin structure (e.g. the fin structure 104) is etched to form a recess (e.g. the recess 120) before implanting the dopants in accordance with some embodiments. Therefore, the dopants can be implanted to a deeper region in the fin structure, and the dopant concentration and distribution may be easier to control. In addition, an annealing process (e.g. the annealing process 124) is performed to form an expanded doped region (e.g. the expanded doped regions 122', 122a', 122b-1', and 122b-2'). After the expanded doped region is formed, a source/drain structure (e.g. the source/drain structures 126, 126a, and 126b) is formed over the expanded doped region, so that the expanded doped region may be seen as an extension of the source/drain structure. Since the profile and the dopant concentration of the expanded doped region may be easier to control, the performance of the source/drain structure having the expanded doped region as the extending portion may be improved.

Furthermore, the side edge of the expanded doped region is located under the gate structure (e.g. the metal gate structure 140) and may be used as a LDD region in the FinFET structure. Accordingly, electron efficiency of the source/drain structure formed over the expanded doped regions may be improved and the resistance of the FinFET structure may be reduced.

Embodiments for forming semiconductor structures are provided. The semiconductor structure may include forming a fin structure and a gate structure over the fin structure. A recess may be formed in the fin structure and a doped region is formed in the fin structure around the recess. Next, a source/drain structure is formed in the recess over the doped region. Since the doped region is formed directly under the source/drain structure, the doped region may be seen as an extension of the source/drain structure. In addition, the profile of the doped region may be easier to control when it is formed after the recess is formed. Therefore, the performance of the source/drain structure may be improved.

In some embodiments, a method for forming a semiconductor structure is provided. The method includes forming a fin structure over a substrate and forming a gate structure across the fin structure. The method further includes recessing the fin structure to form a recess and implanting dopants from the recess to form a doped region. The method further includes diffusing the dopants in the doped region to form an expanded doped region and forming a source/drain structure over the expanded doped region.

In some embodiments, a method for forming a semiconductor structure is provided. The method includes forming a fin structure over a substrate and forming a gate structure across the fin structure. The method further includes forming a gate spacer on a sidewall of the gate structure and etching the fin structure to form a recess. The method further includes forming a doped region under the recess. In addition, a first edge of the doped region is located under the gate spacer. The method further includes annealing the doped region to form an expanded doped region. In addition, a second edge of the expanded doped region is located under the gate structure. The method further includes forming a source/drain structure in the recess.

In some embodiments, a method for forming a semiconductor structure is provided. The method includes forming a first fin structure over a substrate and forming a gate structure across the first fin structure. The method further includes forming a first fin spacer on a sidewall of the first fin structure and recessing the first fin spacer to form a first sloping top surface. The method further includes recessing the first fin structure to form a first recess having a second sloping top surface and forming a first doped region under the first recess. The method further includes forming a source/drain structure over the first doped region.

In some embodiments, a semiconductor structure is provided. The semiconductor structure includes a fin structure protruding from a substrate and a doped region formed in the fin structure. The semiconductor structure further includes a metal gate structure formed across the fin structure and a gate spacer formed on a sidewall of the metal gate structure. The semiconductor structure further includes a source/drain structure formed over the doped region. In addition, the doped region continuously surrounds the source/drain structure and is in direct contact with the gate spacer.

In some embodiments, a semiconductor structure is provided. The semiconductor structure includes a fin structure protruding from a substrate and a metal gate structure formed across the fin structure. The semiconductor structure further includes a doped region formed in the fin structure and a source/drain structure formed over the doped region. In addition, the source/drain structure includes a first region, a second region over the first region, and a third region over the second region. Furthermore, the doped region and the first region of the source/drain structure include a same type of dopants and a dopant concentration in the doped region is lower than a dopant concentration in the first region of the source/drain structure.

In some embodiments, a semiconductor structure is provided. The semiconductor structure includes a first fin structure protruding from a substrate and an isolation structure formed around the first fin structure. The semiconductor structure further includes a metal gate structure formed across the first fin structure and a first doped region formed in the first fin structure. The semiconductor structure further includes a first source/drain structure formed over the first doped region. In addition, a top surface of the first doped region is higher than a top surface of the isolation structure.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
   a fin structure protruding from a substrate;
   a fin spacer formed on a sidewall of the fin structure;
   a doped region formed in the fin structure;
   a metal gate structure formed across the fin structure;
   a gate spacer formed on a sidewall of the metal gate structure; and
   a source/drain structure formed over the doped region,
   wherein the doped region continuously surrounds the source/drain structure and is in direct contact with the gate spacer, and a first height of the fin spacer adjacent to the gate spacer is greater than a second height of the fin spacer away from the gate spacer.

2. The semiconductor structure as claimed in claim 1, wherein the doped region is in direct contact with the metal gate structure.

3. The semiconductor structure as claimed in claim 2, further comprising:
   an isolation structure formed around the fin structure, wherein the doped region is sandwiched between two portions of the isolation structure.

4. The semiconductor structure as claimed in claim 3, wherein the doped region is in direct contact with the isolation structure.

5. The semiconductor structure as claimed in claim 3, wherein an interface between the source/drain structure and the doped region is higher than a top surface of the isolation structure.

6. The semiconductor structure as claimed in claim 1, wherein the fin spacer has a slope top surface.

7. A semiconductor structure, comprising:
   a fin structure protruding from a substrate;
   a metal gate structure formed across the fin structure;
   a doped region formed in the fin structure; and
   a source/drain structure formed over the doped region, wherein the source/drain structure comprises a first region, a second region over the first region, and a third region over the second region,
   wherein the doped region and the first region, the second region, and the third region of the source/drain structure comprise a same type of dopants and a dopant concentration in the doped region is lower than a dopant concentration in the first region of the source/drain structure, and a dopant concentration in the third region is greater than a dopant concentration in the second region, and the dopant concentration in the second region is greater than the dopant concentration in the first region.

8. The semiconductor structure as claimed in claim 7, wherein the source/drain structure has a first thickness and the doped region has a second thickness, and a ratio of the first thickness to the second thickness is in a range from about 0.8 to about 1.2.

9. The semiconductor structure as claimed in claim 7, further comprising:
an isolation structure surrounding the fin structure, wherein the doped region is in direct contact with a sidewall of the isolation structure.

10. The semiconductor structure as claimed in claim 9, wherein an interface between the doped region and the first region of the source/drain structure is higher than a top surface of the isolation structure.

11. The semiconductor structure as claimed in claim 9, wherein an interface between the doped region and the first region of the source/drain structure is lower than a top surface of the isolation structure.

12. A semiconductor structure, comprising:
a first fin structure protruding from a substrate and extending along a first direction;
a first fin spacer formed on a sidewall of the first fin structure;
an isolation structure formed around the first fin structure;
a metal gate structure formed across the first fin structure and extending along a second direction different from the first direction;
a gate spacer formed on a sidewall of the metal gate structure;
a first doped region formed in the first fin structure;
a first source/drain structure formed over the first doped region;
a cap layer covering a top surface and a sidewall of the first source/drain structure; and
a contact formed through the cap layer, wherein a sidewall of the contact is in direct contact with the cap layer,
wherein a top surface of the first doped region is higher than a top surface of the isolation structure, and
wherein the first fin spacer has a slope sidewall and a recessed top portion, and a top surface of the first fin spacer is higher than a top surface of the first doped region.

13. The semiconductor structure as claimed in claim 12, wherein both of the first doped region and the first source/drain structure comprise first dopants.

14. The semiconductor structure as claimed in claim 12, wherein the metal gate structure is directly on the first doped region.

15. The semiconductor structure as claimed in claim 12, wherein the gate spacer is directly on the first doped region.

16. The semiconductor structure as claimed in claim 12, wherein a lateral width of the cap layer in the second direction is greater than a lateral width of the contact in the second direction.

17. The semiconductor structure as claimed in claim 12, wherein a bottom surface of the contact is lower than the top surface of the first source/drain structure covered by the cap layer.

18. The semiconductor structure as claimed in claim 12, wherein the first fin spacer has a first portion closer to the gate spacer and a second portion away from the gate spacer, and the first portion and the second portion of the first fin spacer have different heights.

19. The semiconductor structure as claimed in claim 12, wherein the cap layer is in contact with the top surface of the first fin spacer.

20. The semiconductor structure as claimed in claim 12, further comprising:
a second fin structure protruding from the substrate and extending along the first direction; and
a second fin spacer formed on a sidewall of the second fin structure,
wherein the cap layer is in contact with both the first fin spacer and the second fin spacer.

* * * * *